(12) United States Patent
Paluch, Jr. et al.

(10) Patent No.: US 6,472,922 B1
(45) Date of Patent: Oct. 29, 2002

(54) SYSTEM AND METHOD FOR FLEXIBLY DISTRIBUTING TIMING SIGNALS

(75) Inventors: Edward John Paluch, Jr., Santa Clara; Kuei-Cheng Lin, San Jose, both of CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 09/231,940

(22) Filed: Jan. 14, 1999

(51) Int. Cl.[7] ................................................. H03K 3/00
(52) U.S. Cl. ........................ 327/291; 327/295; 327/296; 327/407
(58) Field of Search ................................ 327/291, 293, 327/295–297, 269, 270, 276, 277, 407, 99, 298

(56) References Cited

U.S. PATENT DOCUMENTS

| | | | | |
|---|---|---|---|---|
| 5,043,596 A | * | 8/1991 | Masuda et al. | 327/297 |
| 5,095,233 A | * | 3/1992 | Ashby et al. | 375/120 |
| 5,444,405 A | * | 8/1995 | Truong et al. | 327/239 |
| 5,504,876 A | | 4/1996 | Dougall et al. | 395/494 |
| 5,663,668 A | * | 9/1997 | Hayashi et al. | 327/156 |
| 5,686,845 A | * | 11/1997 | Erdal et al. | 326/93 |
| 5,731,726 A | * | 3/1998 | Farwell et al. | 327/277 |
| 5,757,212 A | * | 5/1998 | Sevalia | 327/105 |
| 5,831,459 A | * | 11/1998 | McDonald | 327/141 |
| 5,963,075 A | * | 10/1999 | Hiiragizawa | 327/295 |
| 5,994,933 A | * | 11/1999 | Yamanaka et al. | 327/158 |

* cited by examiner

Primary Examiner—Tuan T. Lam
(74) Attorney, Agent, or Firm—Gregory J. Koerner; Simon & Koerner LLP (57) ABSTRACT

The present invention comprises a system and method for flexibly distributing timing signals. Timing signals may require varying delays when connected, via circuit paths of varying propagation delays, to multiple circuit elements in order to preserve circuit synchronization. In one embodiment of the present invention, multiple clock signal generators are programmed to produce clock signals of differing time delays. This programming may be accomplished after the design and fabrication of the circuits utilizing the clock signals. These clock signals are then distributed, via circuit paths of varying propagation delays, to the multiple circuit elements.

6 Claims, 7 Drawing Sheets

SYSTEM AND METHOD FOR FLEXIBLY DISTRIBUTING TIMING SIGNALS

BACKGROUND OF THE INVENTION

1. Field of the Invention

This invention relates generally to improvements in timing distribution and specifically to a system and method for flexibly distributing timing signals between an application specific integrated circuit (ASIC) or a microprocessor and a memory device.

2. Description of the Background Art

Integrated circuits often exchange timing signals among themselves in order to synchronize data and other signal transfers. A common example of these timing signals is a clock signal, often used to synchronize the transfer of data between an ASIC or a processor and a memory device. Clock signals allow the transfer of data after numerous parallel data lines reach a stable logical state, thus eliminating data corruption.

In order for clock signals to accurately synchronize the data transfers, the clock signals must arrive at destination points in the circuit in the correct time sequence. It may be difficult to ensure the arrival of the clock signals in the correct time sequence when the clock signals originate at or near a single point on the die of the processor or ASIC. Clock signals may be delayed due to varying distances of propagation, and also due to parasitic impedances in the integrated circuit's die, pads, bond wires, leads, and the printed circuit board's traces. This situation in which the clock signals arrive at varying points at different times is referred to as clock skew.

Figure 1:
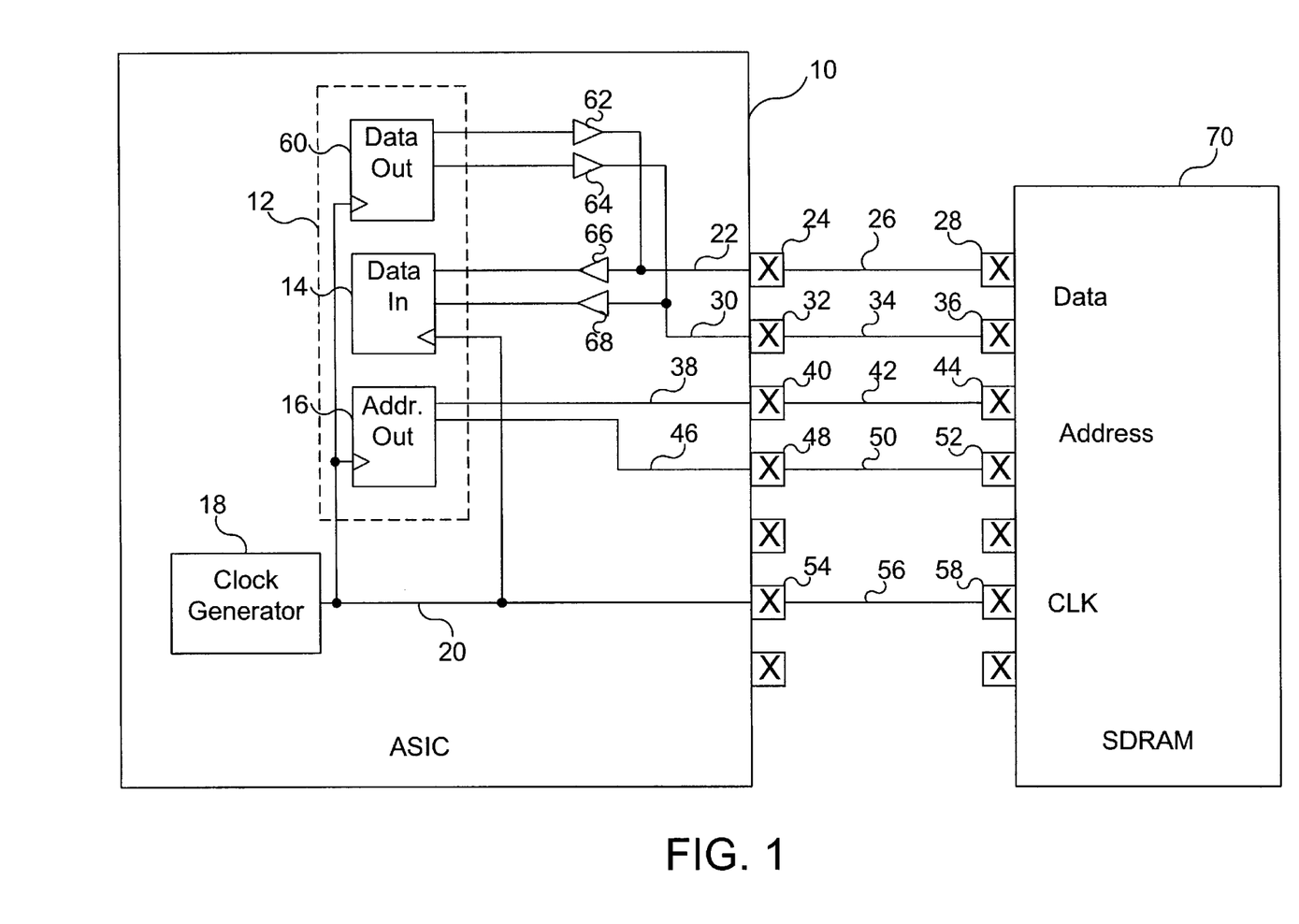
FIG. 1 is a block diagram for a direct attachment of an application specific integrated circuit (ASIC) to a synchronous dynamic random access memory (SDRAM)

Referring now to FIG. 1, a block diagram for a direct attachment of an application specific integrated circuit (ASIC) 10 to a synchronous dynamic random access memory (SDRAM) 70 is shown. In the FIG. 1 embodiment, ASIC 10 is chosen as an exemplary circuit, but may be a microprocessor or other electronic circuit in alternate embodiments. Similarly, in the FIG. 1 embodiment SDRAM 70 is shown, but in alternate embodiments SDRAM 70 may be any other type of memory device or any other type of integrated circuit requiring an external clock signal.

ASIC 10 includes a localized area 12 where the data input flip-flops 14, data output flip-flops 60, and address output flip-flops 16 are located. Data input flip-flops 14, data output flip-flops 60, and address output flip-flops 16 may latch a large number of signals, but for clarity the exemplary FIG. 1 example shows only two signals each. Data input flip-flops 14 connect via buffers 66, 68, to data lines 22, 30. Data output flip-flops 60 connect via tri-state buffers 62, 64, to data lines 22, 30. Data input flip-flops 14, data output flip-flops 60, and address output flip-flops 16 are clocked by a clock signal generated by clock generator 18 and distributed on clock signal line 20. The clock signal generated by clock generator 18 also clocks SDRAM 70 via a path that includes clock signal line 20, pad, bond-wire, and lead 54, printed circuit board (PCB) trace 56, and pad, bond-wire, and lead 58. Due to the additional path length and impedance, the clock signal will arrive at SDRAM 70 at some time subsequent to the clock signal's arrival at data input flip-flops 14 and address output flip-flops 16. The foregoing is an example of clock skew.

Address signals generated by address output flip-flops 16 travel to SDRAM 70 along paths of varying length and impedance. One address signal travels via a path including address line 38, pad, bond-wire, and lead 40, printed circuit board (PCB) trace 42, and pad, bond-wire, and lead 44. Another address signal travels via a path including address line 46, pad, bond-wire, and lead 48, printed circuit board (PCB) trace 50, and pad, bond-wire, and lead 52. Because address output flip-flops 16 are within localized area 12, and because the pads, bond-wires, and leads 40 and 48 are distributed around the periphery of the die and package of ASIC 10, the address signals have differing propagation delays leaving ASIC 10. Additionally, PCB traces 42 and 50, and the pads, bond-wires, and leads 44 and 52 of SDRAM 70 may also possess differing lengths and configurations. For all of these reasons, the address signals may have very different propagation delays and times of arrival in SDRAM 70.

A similar situation occurs with the data signals arriving at data input flip-flops 14 from SDRAM 70. One data signal arrives at data input flip-flops 14 via pad, bond-wire, and lead 28, PCB trace 26, pad, bond-wire, and lead 24, data line 22, and buffer 66. Another data signal arrives at data input flip-flops 14 via pad, bond-wire, and lead 36, PCB trace 34, pad, bond-wire, and lead 32, data line 30, and buffer 68. For reasons analogous to those stated above in the discussion of the address signals, the data signals may have very different propagation delays and times of arrival in data flip-flops 14.

The foregoing differences in the propagation delays of the address, data, and clock signals may combine to cause errors in data transfer synchronization. For example, if the address flip-flops in SDRAM 70 are clocked before the address signals have stable values, an erroneous address may be input into SDRAM 70. Similarly, if the data flip-flops 14 are clocked before the data signals have stable values, erroneous data may be input into data flip-flops 14 of ASIC 10. Timing is therefore a significant consideration in the design of electronic circuits.

SUMMARY OF THE INVENTION

The present invention includes a system and method for flexibly distributing timing signals. Separate programmable clock generators generate and distribute clock signals which vary in delay with respect to one another. The programmable clock generators may be designed and fabricated prior to determining the relative delays needed in a particular application. The relative delays needed may then be programmed into the circuits after fabrication. Allowing the programming of the delays after the circuits are fabricated may allow for shorter development cycles.

In one embodiment of the present invention, five programmable clock generators (CG) CG1, CG2, CG3, CG4, and CG5 generate and distribute five programmable clock signals labeled CLK1, CLK2, CLK3, CLK4, and CLK5, respectively. In one embodiment, the five clock generators CG1 through CG5 are five identical circuits located within the synchronous dynamic random-access-memory (SDRAM) clocks module of an application specific integrated circuit (ASIC) controller. In alternate embodiments, CG1 through CG5 may be non-identical circuits.

Each clock generator preferably includes two clock signal input terminals, AIN and BIN. Each clock generator includes a clock signal output terminal COUT. In one embodiment, the AIN input terminals are all tied to a common dynamic-random-access-memory (DRAM) clock labeled DCLK. In one embodiment, DCLK is generated by a clock generator external to the controller. In alternate embodiments, DCLK may be generated within the ASIC controller.

The BIN input terminals are intended for use with a clock signal which has been externally looped-back. In one embodiment, the BIN input terminals of CG1 and CG2 are connected to the loopback connection's pad, bond-wire, and lead of the ASIC. The BIN input terminals of CG3, CG4, and CG5 are not used, and therefore are tied to logic high (Vcc). Should it be determined that the BIN input terminals of CG1 and CG2 will not be used in a particular application, the loopback connection's pad, bond-wire, and lead may be tied to a logic high that is external to the ASIC controller.

In one embodiment, the ASIC utilizes a control bus, and the memory controller of the ASIC includes a control bus interface. A signal line provides the contents of programmable registers within the control bus interface to each of the clock generators CG1, CG2, CG3, CG4, and CG5.

The clock signal output terminals COUT on the five programmable clock generators CG1, CG2, CG3, CG4, and CG5 are connected to various clock distribution signal lines. The clock signal output terminal COUT of CG1 is connected to the CLK1 distribution signal line. The CLK1 distribution signal line sends CLK1 to the clock input terminal of the first-stage pipeline data input flip-flop. The clock signal output terminal COUT of CG2 is connected to the CLK2 distribution signal line. The CLK2 distribution signal line sends CLK2 to the clock input terminal of the second-stage pipeline data input flip-flop. The clock signal output terminal COUT of CG3 is connected to the CLK3 distribution signal line. The CLK3 distribution signal line sends CLK3 to the SDRAM interface. The clock signal output terminal COUT of CG4 is connected to the CLK4 distribution signal line. The CLK4 distribution signal line sends CLK4 off the die of the ASIC controller via a pad, bond-wire, and lead. CLK4 is intended for use by the external SDRAM, and may also be looped-back to CG1 and CG2 via loopback pad, bond-wire, and lead. The clock signal output terminal COUT of CG5 is connected to the CLK5 distribution signal line. The CLK5 distribution signal line sends CLK5 to the clock input terminals of the data output flip-flop, the auxiliary data output flip-flop, the address output flip-flop, the row-address asserted strobe (RAS) and column-address asserted strobe (CAS) flip-flop, and the SDRAM control signals flip-flop.

The two clock signal input terminals, AIN and BIN, of each clock generator, CG1 through CG5, may be attached to a chain of digital buffer elements. At designated places in these chains, signal taps may be taken. The signals at these signal taps are clock signals delayed by amounts equal to the sum of the individual delays of the digital buffer elements prior to the signal tap. Any of the signals at the various signal taps may be selected for use as a delayed clock signal. The selection may be under software control by utilizing a selection mulitiplexor driven by the programmable register in the control bus interface. Thus, because the selection of clock delays is under software control, the delays may be programmed into the circuits after fabrication, and the delays may be tailored to a particular application of the circuits.

DETAILED DESCRIPTION OF THE PREFERRED EMBODIMENT

The present invention relates to an improvement in timing distribution flexibility. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention comprises an efficient system and method for flexibly distributing timing signals. Timing signals may require varying delays when connected, via circuit paths of varying propagation delay, to multiple circuit elements in order to preserve circuit synchronization. In one embodiment of the present invention, multiple clock signal generators are programmed to produce clock signals of differing time delays. This programming may be accomplished after the design and fabrication of the circuits utilizing the clock signals, allowing for compensation for semiconductor fabrication process-induced variations. These clock signals are then distributed, via circuit paths of varying propagation delays, to the multiple circuit elements.

Figure 2:
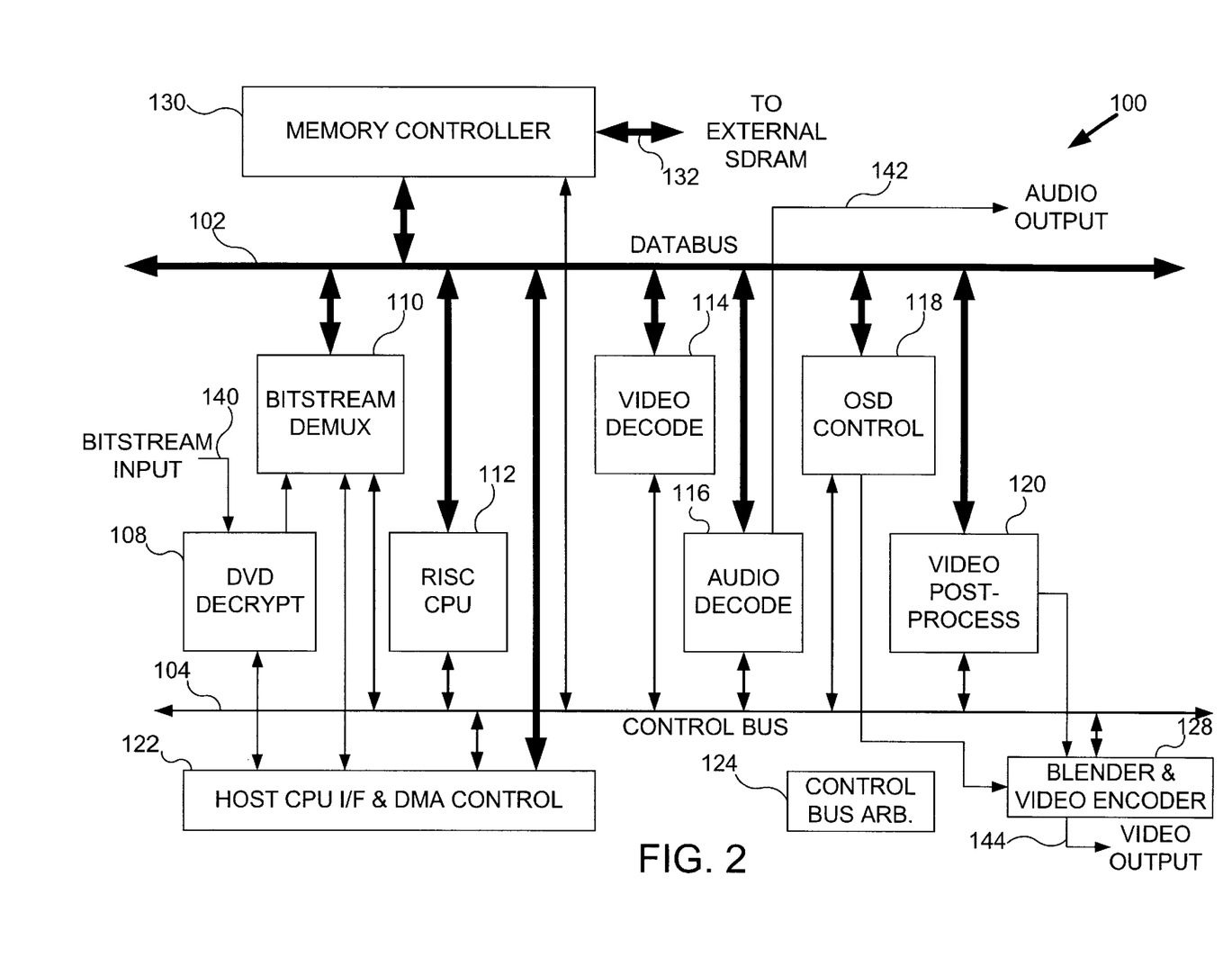
FIG. 2 is a block diagram for a controller for a digital audio and video player, in accordance with one embodiment of the present invention.

Referring now to FIG. 2, a block diagram for a controller 100 for a digital audio and video player is shown, in accordance with one embodiment of the present invention. Controller 100 is shown and described as an exemplary embodiment of the present invention. However, the present invention is not limited to the exemplary embodiment. The present invention may be practiced in any circuit, such as a microprocessor or an application specific integrated circuit (ASIC), which sources clock or other timing signals.

Controller 100 may be used as the controller for a digital video disk (DVD) player or for a digital video broadcast (DVB) set-top-box. Controller 100 preferably includes two primary data busses: databus 102 and control bus 104. Many of the functional components of controller 100 connect to both databus 102 and control bus 104. These functional components may include DVD decryption 108, bitstream demultiplexor 110, reduced instruction set computer (RISC) central processing unit (CPU) 112, video decoder 114, audio decoder 116, on-screen display (OSD) controller 118, video post-processing filter 120, host CPU interface and direct memory access (DMA) controller 122, control bus arbitrator 124, blender and video encoder 128, and memory controller 130.

Databus 102 transfers data in 64-bit wide-words (or eight 8-bit bytes) on 64 physical data lines. The logical addressing space used to transfer data in 64-bit wide-words is called databus space. Databus 102 transfers compressed bitstreams, video reference and reconstructed pixel data, OSD graphics data, and several other data types between the functional components and external synchronous dynamic random-access-memory (SDRAM, not shown) via memory controller 130. Databus 102 also includes a 7-bit wide channel arbitration bus for determining the order of transfers when requested by numerous functional components.

Control bus 104 allows RISC CPU 112 or an external host CPU (not shown) to control the functional components via read/write registers via host CPU interface and DMA controller 122. Control bus 104 transfers data in 16-bit words on 16 physical data lines. Control bus arbitration 124 determines the order of transfers on control bus 104. Control bus 104 also transfers 32-bit addresses for use in databus 102 memory read and write operations in the form of two 16-bit words.

Memory controller 130 controls data transfers between the databus 102 and the external SDRAM. Memory controller 130 also controls databus 102. The detailed operation of memory controller 130 is further described in conjunction with FIG. 3 below.

Digital audio, digital video, and other digital data enters controller 100 at DVD decryption 108 via bitstream input signal 140. DVD decryption 108 decrypts copy-protected data when the bitstream is derived from a DVD. When the bitstream is derived from DVB, DVD decryption 108 passes the data through without alteration. In either case, the data is presented to bitstream demultiplexor 110 which parses the bitstream into digital audio, digital video, and other digital data. These individual parsed data types are then sent to external synchronous dynamic random-access memory (SDRAM) (not shown) via databus 102, memory controller 130, and external SDRAM connection 136.

RISC CPU 112 communicates with, and controls, other functional components of controller 100 via databus 102 and control bus 104. RISC CPU 112 also communicates with an external CPU (not shown) via host CPU interface and DMA controller 122 for passing user interface data.

Video decoder 114 decompresses compressed digital video data that is stored temporarily in external SDRAM (not shown), and sends the resulting decompressed digital video data to video post-processing filter 120. Audio decoder 116 likewise decompresses compressed digital audio data, stored temporarily in external SDRAM, and sends the resulting decompressed digital audio data from controller 110 via audio output signal 142 in the form of multi-channel pulse-code modulated (PCM) digital audio data.

Multi-function OSD controller 118 generates graphics patterns for superimposing over decoded video data, and additionally may produce sub-picture graphics such as floating cursors. Video post-processing filter 120 resizes image data and also filters the image data for letterbox displays. Video post-processing filter 120 additionally may change the chroma format and perform blending of four alpha planes.

Blender and video encoder 128 takes video data from OSD controller 118 and video post-processing filter 120 and combines the data to form the actual digital video signal to be displayed. Blender and video encoder 128 then encodes this actual digital video signal in one of several analog video signal formats, such as national television standards committee (NTSC) or phase alternate line (PAL), in either composite video or component video format.

In the discussion of FIG. 2 above, the present invention was specifically disclosed in the environment of an ASIC controller for digital audio and video interfacing with an external SDRAM. However, the present invention may be practiced wherever there exists a necessity for distributing timing signals among several integrated circuits, and should not be construed as being limited to interfacing an ASIC with a SDRAM. In alternate embodiments, the ASIC may be designed for any intended application, or may be replaced by a microprocessor. Similarly, in alternate embodiments the external SDRAM may be any other type of memory device, or any other type of integrated circuit requiring an external clock signal.

Figure 3:
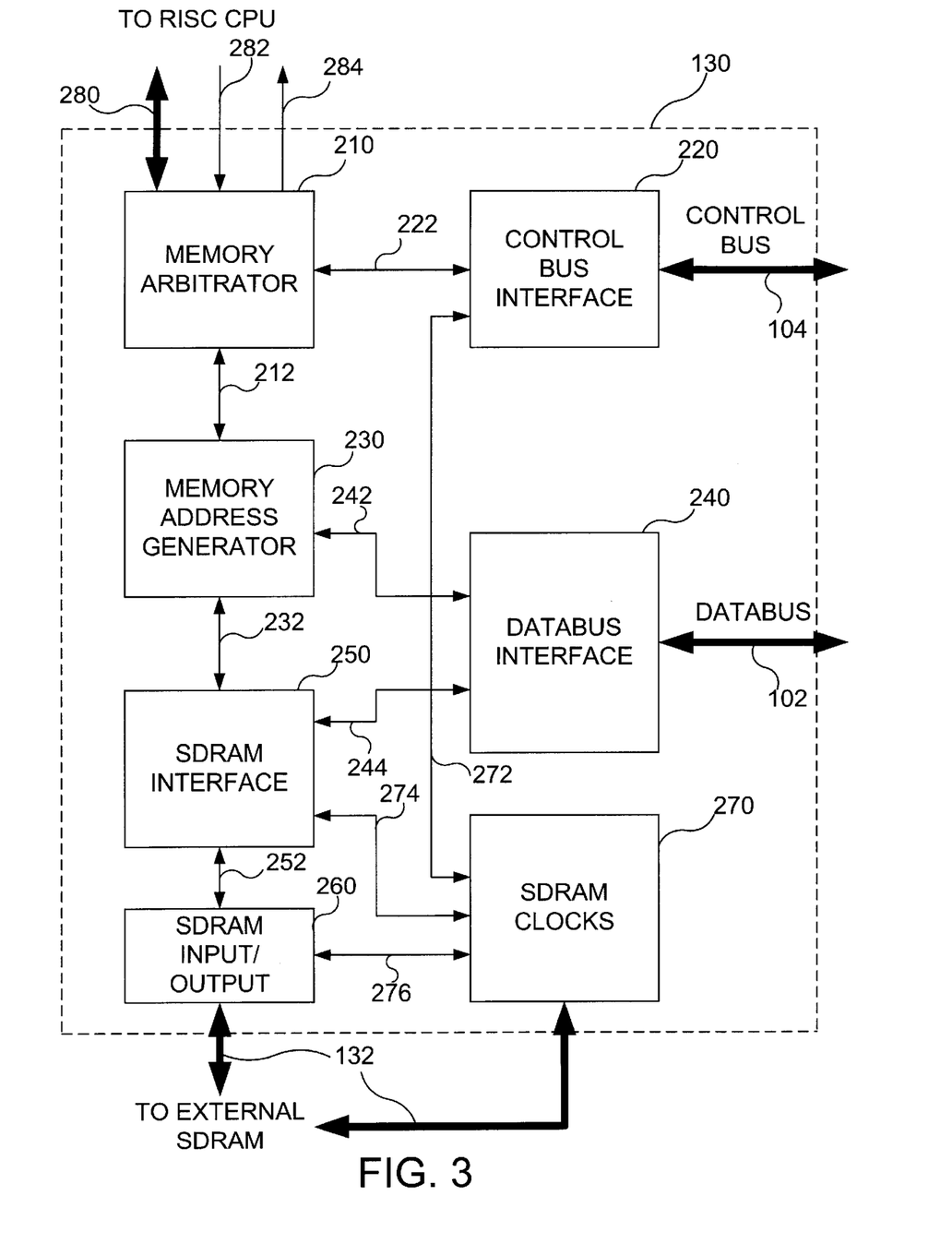
FIG. 3 is a block diagram for one embodiment of the memory controller of FIG. 2, in accordance with the present invention.

Referring now to FIG. 3, a block diagram for one embodiment of the memory controller 130 of FIG. 2 is shown, in accordance with the present invention. In the preferred embodiment, memory controller 130 primarily transfers 64-bit wide-word data from databus 102 to an external SDRAM (not shown) via 16-bit SDRAM connection 132. In one embodiment, databus 102 is clocked at 27 MHz and SDRAM connection 132 is clocked at 94.5 MHz. In alternate embodiments the wide-words could be 32 bits wide, 128 bits wide, or any other width necessitated by the system architecture, and the physical memory connection may be of any width.

Memory arbitrator 210 determines the order in which functional components attached to databus 102 may transfer data to or from SDRAM. The arbitration scheme used by memory arbitrator 210 to select that transfer order is configurable by registers which can be written via control bus 104. Control bus interface 220 receives configuration information from control bus 104 and transfers the configuration information to memory arbitrator 210.

Memory arbitrator 210 also receives a 32-bit address on a private address bus connecting RISC CPU 112 to memory controller 130. The private address bus includes direct-memory access [DMA] address lines 280, DMA request line 282, and DMA busy line 284. When memory arbitrator 210 determines that a particular request for memory access should be granted, memory arbitrator 210 delivers the 32-bit address and the respective channel number to memory address generator 230. Each functional component on databus 102 is preferably assigned a unique number, called a channel number, for data routing. The 32-bit address delivered to memory address generator 230 contains a dynamic-random-access-memory (DRAM) byte address (DBA), and also a byte-count minus one (BC−1) which shows how many bytes are to be transferred during the memory access.

During a memory write cycle, memory address generator 230 generates one or more individual addresses onto signal line 232, and also generates an outgoing channel number signal on signal line 242 so that databus interface 240 may receive data words from the appropriate functional component. Upon receipt of its corresponding channel number signal, the functional component sends its data via databus 102 to write buffers in SDRAM interface 250. The addresses generated by memory address generator 230 expand the single incoming 32-bit address into a number of individual addresses. Each of these individual addresses specifies the location of a 64-bit wide-word in databus 102 virtual memory space.

The SDRAM used in the present invention need not be physically configured as a 64-bit wide-word memory. It may be only virtually configured as 64-bit wide-word memory. In one embodiment, the SDRAM is physically configured as a 16-bit data word memory. SDRAM interface 250 transfers each 64-bit wide-word write datum from the write buffers in SDRAM interface 250 to SDRAM input/output 260 as four 16-bit words. SDRAM input/output 260 contains interface circuitry, including small buffers, to write the four 16-bit word transfers into SDRAM.

Memory controller 130 includes SDRAM clocks 270 module. SDRAM clocks 270 may be programmed by writing into registers resident within control bus interface 220. The contents of these registers are presented to SDRAM clocks 270 via signal line 272. SDRAM clocks 270 may present the appropriate clock signals to SDRAM interface 250 and SDRAM input/output 260 via clock signal lines 274 and 276, respectively. The clock signal for the external SDRAM (not shown) may be included in SDRAM connection 132.

In the discussion of FIG. 3 above, the present invention was specifically disclosed in the environment of an ASIC controller for digital audio and video interfacing with an SDRAM. However, the type of memory accessed by the present invention is not limited to the SDRAM of the exemplary implementation, but may be any form of read/write memory such as static random-access-memory (SRAM) or other forms of dynamic-random-access-memory (DRAM), or the integrated circuit attached to the ASIC may not be a memory device at all.

Figure 4:
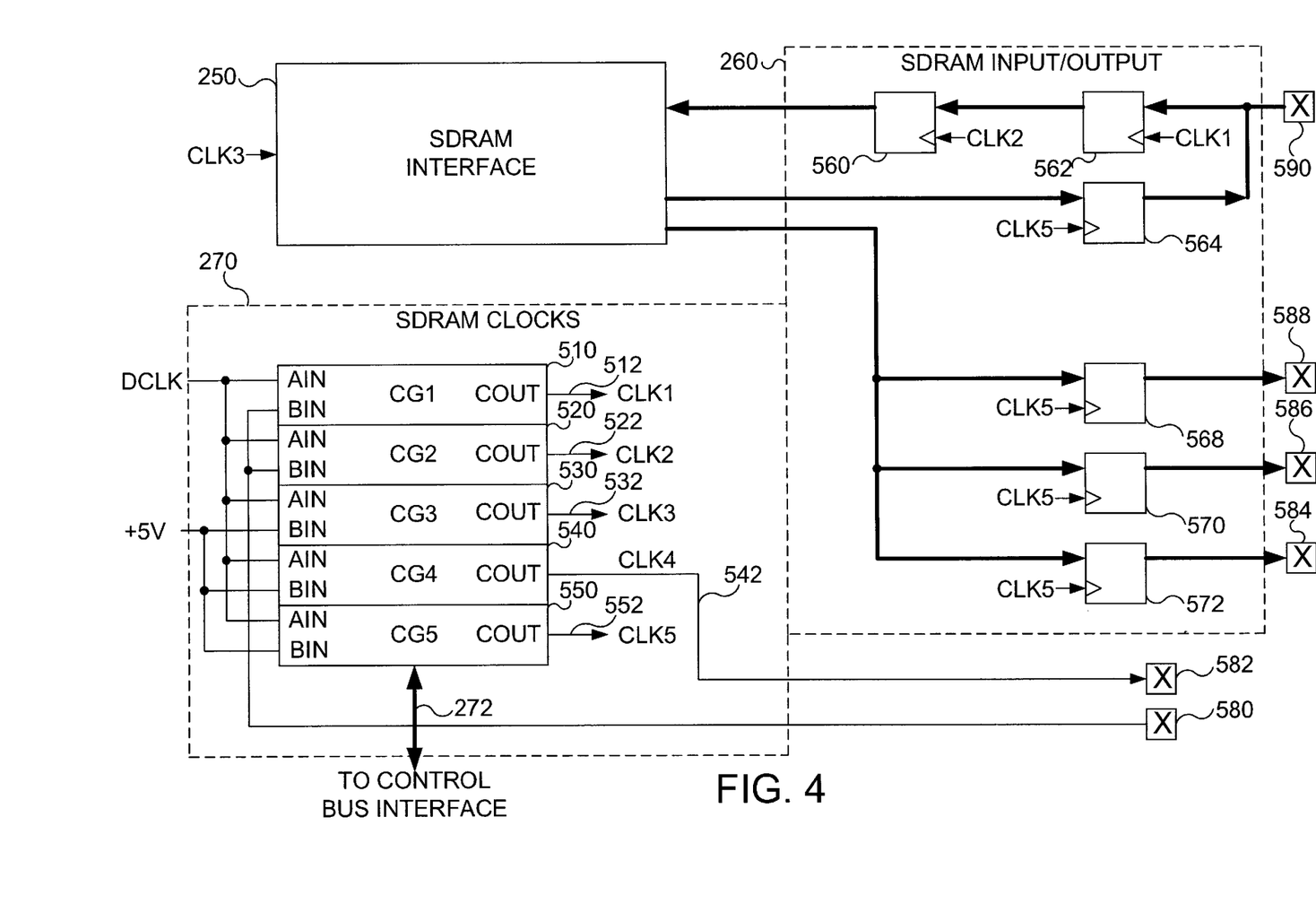
FIG. 4 is a diagram showing generation and distribution of flexible timing in the memory controller of FIG. 3, in accordance with one embodiment of the present invention.

Referring now to FIG. 4, a diagram showing generation and distribution of flexible timing in the memory controller 130 of FIG. 3 is shown, in accordance with one embodiment of the present invention. In the FIG. 4 embodiment, five programmable clock generators (CG) CG1 510, CG2 520, CG3 530, CG4 540, and CG5 550 generate and distribute five programmable clock signals labeled CLK1, CLK2, CLK3, CLK4, and CLK5, respectively. In one embodiment the five clock generators CG1 510 through CG5 550 are five identical circuits located within SDRAM clocks 270. In alternate embodiments, CG1 510 through CG5 550 may be non-identical circuits.

Each clock generator includes two clock signal input terminals, AIN and BIN. Each clock generator includes a clock signal output terminal COUT. In the FIG. 4 embodiment, the AIN input terminals are all tied to a common dynamic-random-access-memory (DRAM) clock labeled DCLK. In one embodiment DCLK is generated by a clock generator external to controller 100. In alternate embodiments DCLK may be generated within controller 100. The BIN input terminals are intended for use with a clock signal which has been externally looped-back. This looping back may be accomplished for CLK4 by connecting pads, bond-wires, and leads 580 and 582 by a PCB trace external to controller 100. Looping back the clock signal external to controller 100 beneficially adds the delays created by the parasitic impedances of pads, bond-wires, and leads 580 and 582. In the FIG. 4 embodiment, the BIN input terminals of CG1 510 and CG2 520 are connected to pad, bond-wire, and lead 580. The BIN input terminals of CG3 530, CG4 540, and CG5 550 are not used, and therefore are tied to logic high (+5 Volts). Should it be determined that the BIN input terminals of CG1 510 and CG2 520 will not be used in a particular application, then pad, bond-wire, and lead 580 may be tied to a logic high external to controller 100.

Signal line 272 provides the contents of programmable registers within control bus interface 220 to each of the clock generators CG1 510, CG2 520, CG3 530, CG4 540, and CG5 550. Further details of the signal line 272 connection are discussed below in conjunction with FIG. 7.

The clock signal output terminals COUT on the five programmable clock generators CG1 510, CG2 520, CG3 530, CG4 540, and CG5 550 are connected with various clock distribution signal lines. The clock signal output terminal COUT of CG1 510 is connected to CLK1 distribution signal line 512. CLK1 distribution signal line 512 sends CLK1 to the clock input terminal of first-stage pipeline data input flip-flop 562. The clock signal output terminal COUT of CG2 520 is connected to CLK2 distribution signal line 522. CLK2 distribution signal line 522 sends CLK2 to the clock input terminal of second-stage pipeline data input flip-flop 560. The clock signal output terminal COUT of CG3 530 is connected to CLK3 distribution signal line 532. CLK3 distribution signal line 532 sends CLK3 to SDRAM interface 250. The clock signal output terminal COUT of CG4 540 is connected to CLK4 distribution signal line 542. CLK4 distribution signal line 542 sends CLK4 off the die of controller 110 via pad, bond-wire, and lead 582. CLK4 is intended for use by the external SDRAM, and may also be looped-back to CG1 510 and CG2 520 via pad, bond-wire, and lead 580. The clock signal output terminal COUT of CG5 550 is connected to CLK5 distribution signal line 552. CLK5 distribution signal line 552 sends CLK5 to the clock input terminals of data output flip-flop 564, address output flip-flop 568, row-address asserted strobe (RAS) and column-address asserted strobe (CAS) flip-flop 570, and SDRAM control signals flip-flop 572.

Figure 5:
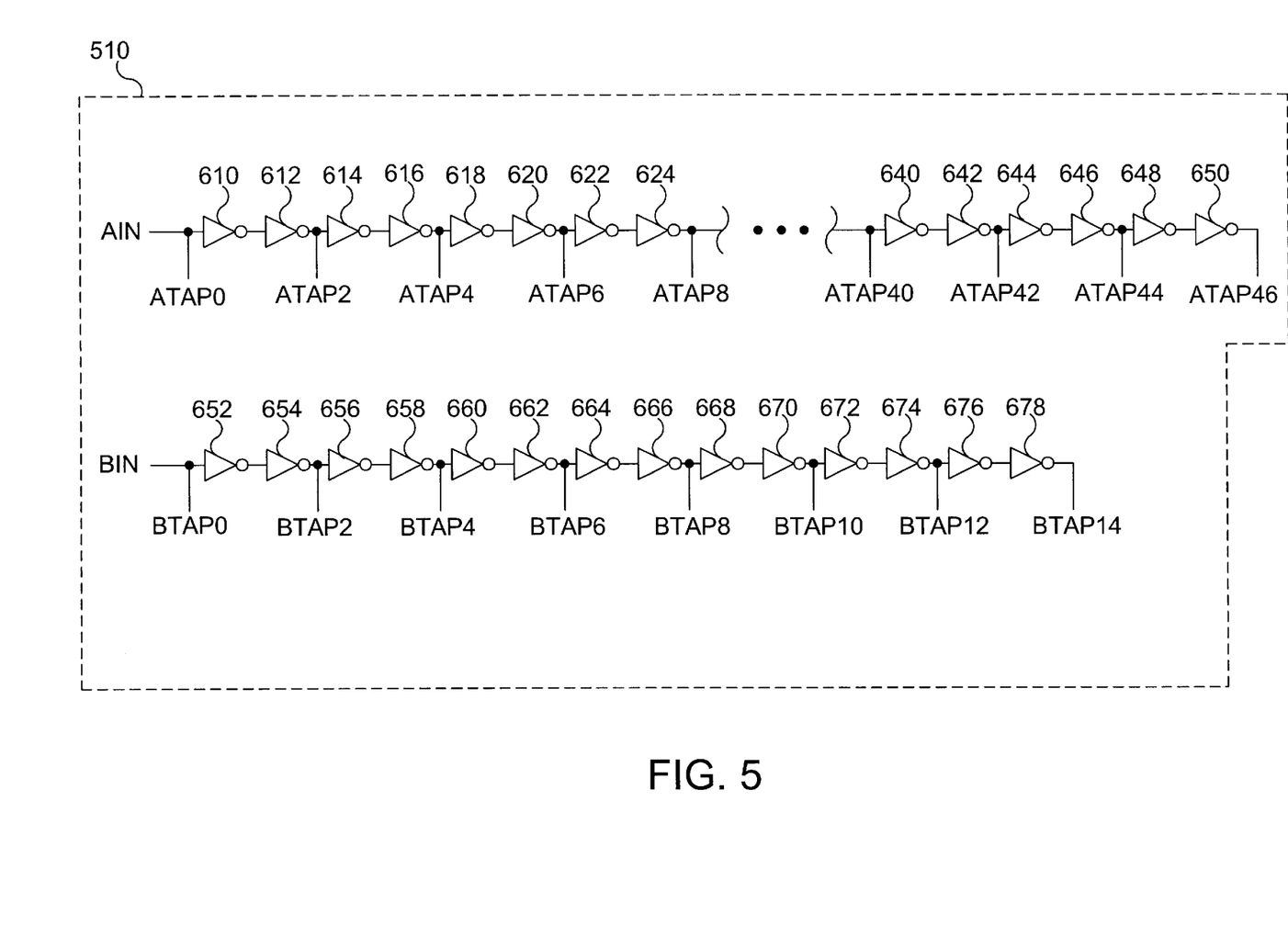
FIG. 5 is a diagram showing timing delay circuits for the clock generator circuits of FIG. 4, in accordance with one embodiment of the present invention.

Referring now to FIG. 5, a diagram showing timing delay circuits for the clock generator circuits CG1 510, CG2 520, CG3 530, CG4 540, and CG5 550 of FIG. 4 is shown, in accordance with one embodiment of the present invention. For the purpose of illustration and clarity, only the timing delay circuits of CG1 510 are shown. In the FIG. 5 embodiment, the digital delay elements are inverting buffers. The use of inverting buffers beneficially preserves the duty-cycle of the input clock signals, defined as the percentage of time the clock signal is in the logic high state. Because a buffer may have differing times for transitioning from low-to-high and from high-to-low, passing a clock through a buffer may add time to either the time spent in the high state or the time spent in the low state. Inverting the clock each time minimizes this effect, preserving the duty-cycle. In alternate embodiments, other digital delay elements may readily be used.

The delay circuits progressively delay any clock signals connected to input terminals AIN and BIN. In the FIG. 5 embodiment, a chain of 46 inverting buffers 610 through 650 progressively delays a clock signal sent to input terminal AIN. (Inverting buffers not shown are not numbered.) A chain of 14 inverting buffers 652 through 678 progressively delays a clock signal sent to input terminal BIN. In one embodiment of the present invention, AIN may be directly connected to a clock signal and BIN may be connected to a clock signal that has been looped-back externally to controller 100 via pads, bond-wires, and leads 580 and 582. Because of the substantial delay introduced by traversing pads, bond-wires, and leads 580 and 582, fewer additional inverting buffers need be connected to input terminal BIN as compared with input terminal AIN.

Each inverting buffer adds approximately 200 to 300 picoseconds (ps) delay. Progressively-delayed clock signals are provided at signal taps that are connected after each pair of inverting buffers. As examples, ATAP0 provides the signal applied at AIN with no additional delay, ATAP2 provides the signal applied at AIN delayed by two inverting buffers 610, 612, ATAP6 provides the signal applied at AIN delayed by six inverting buffers 610 through 620, and ATAP46 provides the signal applied at AIN delayed by forty-six inverting buffers 610 through 650. Similarly, BTAP0 provides the signal applied at BIN with no additional delay, and BTAP10 provides the signal applied at BIN that has been delayed by ten inverting buffers 652 through 670.

Figure 6:
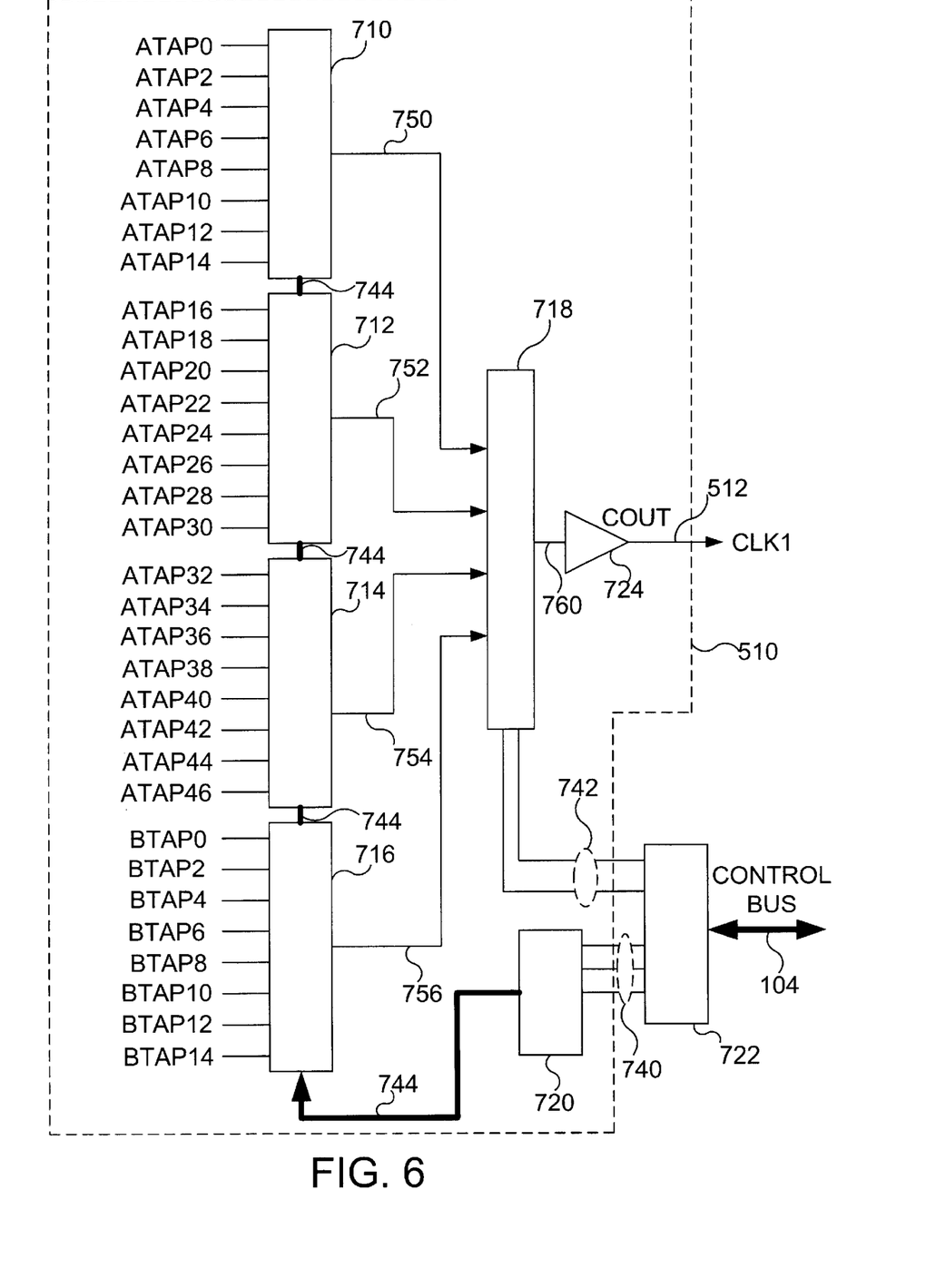
FIG. 6 is a diagram showing programmable selection of timing signals, in accordance with one embodiment of the present invention.

Referring now to FIG. 6, a diagram showing programmable selection of timing signals is shown, in accordance with one embodiment of the present invention. Again, only details of CG1 510 (FIGS. 4 and 5) are shown for the purpose of illustration and clarity. FIG. 5 showed the connections of signal taps ATAP0 through ATAP46 and BTAP0 through BTAP14 to the corresponding points in the chains of inverting buffers. FIG. 6 shows the selection of one signal tap from ATAP0 through ATAP46 or BTAP0 through BTAP14 to serve as the source of the signal on the clock output terminal COUT.

In the FIG. 6 embodiment, eight-to-one multiplexors 710, 712, 714, and 716 each have their eight multiplexor inputs connected to eight of the signal taps. For example, the eight multiplexor inputs of eight-to-one multiplexor 710 are connected to ATAP0 through ATAP14.

Included within control bus interface 220 are registers for each of the clock generators CG1 510 through CG5 550. Shown in FIG. 6 is exemplary register 722 for CG1 510. During power-on initialization, RISC CPU 112 of controller 100 preferably sends a previously-determined 5-bit value to register 722. This 5-bit value is stored in register 722, and is present on the five output lines 740 and 742 of register 722.

The three least-significant bits of the 5-bit value are present on three output lines 740. These three least-significant bits are decoded by decoder 720. Eight individual multiplexor select lines 744 are provided simultaneously by decoder 720 to the select lines of eight-to-one multiplexors 710, 712, 714, and 716. When multiplexor select lines 744 are provided simultaneously by decoder 720 to the select lines of eight-to-one multiplexors 710, 712, 714, and 716, one of the signal taps attached to each eight-to-one multiplexor 710, 712, 714, and 714 is routed to multiplexor output lines 750, 752, 754, and 756, respectively. For example, if the three least-significant bits of the 5-bit value are all zeros, then the signal from signal tap ATAP0 is routed to multiplexor output line 750, the signal from signal tap ATAP16 is routed to multiplexor output line 752, the signal from signal tap ATAP32 is routed to multiplexor output line 754, and the signal from signal tap BTAP0 is routed to multiplexor output line 756.

The two most-significant bits of the 5-bit value are present on two output lines 742. The two most-significant buts are provided to the select lines of four-to-one multiplexor 718 in order to select one of the four input signals for routing to the output of for-to-one multiplexor 718. Continuing with the example above, if the two most-significant bits of the 5-bit value are both ones, then the signal from signal tap BTAP0 present on multiplexor output line 756 is routed to multiplexor output line 760.

Multiplexor output line 760 is preferably buffered by line driver 724. The output signal of line driver 724 forms the clock output terminal COUT. This clock output terminal COUT is connected to CLK1 distribution signal line 512.

Thus, using the programmable multiplexors of FIG. 6, the clock generators of FIG. 4 are able to select one of the many delayed clock signals available on the signal tap connections, under the control of a programmable register in control bus interface 220. This facilitates configuring the clock delays after the controller 100 is designed and fabricated. The setting of the clock delays subsequent to the fabrication of controller 100 allows control over timing accuracy across a wide range of semiconductor fabrication process-induced variation.

Figure 7:
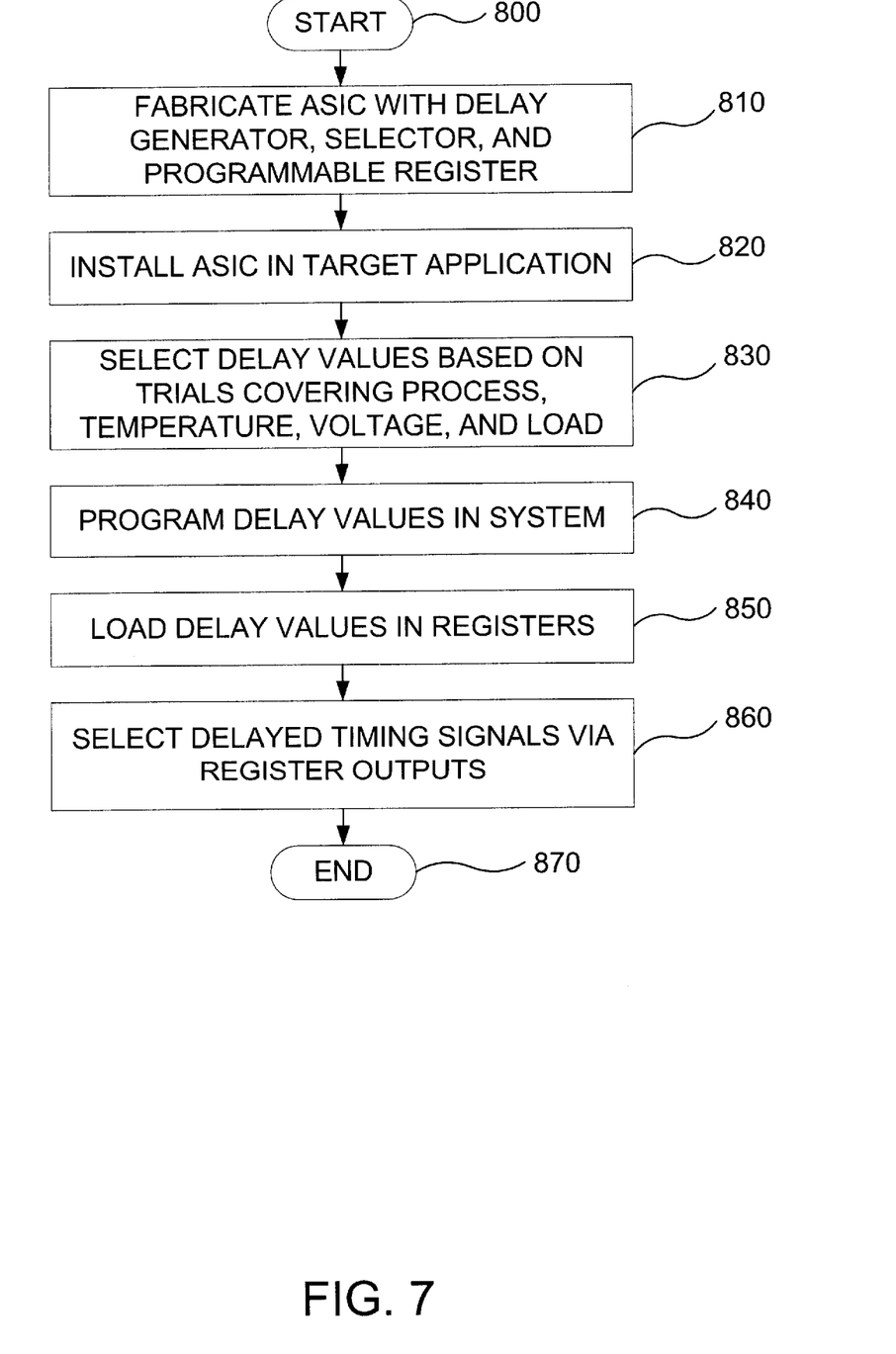
FIG. 7 is a flowchart of method steps for implementing flexibly distributed timing signals, in accordance with one embodiment of the present invention.

Referring now to FIG. 7, a flowchart of method steps for implementing flexibly distributed timing signals is shown, in accordance with one embodiment of the present invention. The FIG. 7 process starts in step 800 when the design and fabrication of an ASIC, controller 100, commences. In alternate process embodiments, controller 100 of FIG. 2 as described in the following discussion of FIG. 7 may be a general-purpose microprocessor, a digital signal processor, or other appropriate circuitry.

In the FIG. 7 process, different organizations of people may execute the process at differing steps. There may be a separate design organization and an integration organization for the integrated circuits.

In step 810, the design organization designs, debugs, and fabricates controller 100. At this stage controller 100 is complete with programmable clock generators CG1 510, CG2 520, CG3 530, CG4 540, and CG5 550 and CLK1 through CLK5 distribution signal lines 512, 522, 532, 542, and 552 of FIG. 4. It is noteworthy that controller 100 may be fabricated and ready for sale prior to determining the clock delays necessary for the elimination of clock skew problems.

Then, in step 820, the integration organization places controller 100 in the desired target application, which may include a PCB with traces and one or more SDRAM modules. Once controller 100 is in the target environment, then, in step 830, the integration organization may determine the binary delay values, corresponding to the necessary delay times, by experiment or by simulation. The determination of the delay values may take into consideration factors from the anticipated environment of the target application. Factors from the anticipated environment of the target application may include variations induced by the semiconductor fabrication process, as well as variations in temperature, supply voltage, and anticipated logic loading. In cases where differing numbers of SDRAM modules may be allowed, the variations in logic loading may not permit a single set of delay values for all configurations. In such cases the present invention advantageously permits determining differing sets of delay values for the different configurations.

Once the delay values are determined, then, in step 840, the integration organization may program the delay values into the target application. The programming may take the form of programming a non-volatile device, such as electronically programmable read-only memory (EPROM) or flash memory. The location of the non-volatile device may be within controller 100, or external to controller 100. Once the target application is programmed, it is ready for distribution and sale.

In step 850, the target application, including controller 100, is powered on. During the power-on initialization, RISC CPU 112 of FIG. 2 retrieves the delay values and loads the delay values into the programmable registers, of which register 722 of FIG. 6 is exemplary. Then, in step 860, programmable clock generators CG1 510, CG2 520, CG3 530, CG4 540, and CG5 550 select the correctly-delayed clock signals via the delay values in the programmable registers, of which register 722 is exemplary. Because the correctly-delayed clock signals feed the circuits in the connection between controller 100 and the SDRAM, controller 100 and the SDRAM will henceforth communicate free from skew errors. The process of implementing flexibly distributed timing signals may then end, in step 870.

The invention has been explained above with reference to a preferred embodiment. Other embodiments will be apparent to those skilled in the art in light of this disclosure. For example, the present invention may readily be implemented using configurations and techniques other than those described in the preferred embodiment above. Additionally, the present invention may effectively be used in conjunction with systems other than the one described above as the preferred embodiment. Therefore, these and other variations upon the preferred embodiments are intended to be covered by the present invention, which is limited only by the appended claims.

What is claimed is:

1. A distribution system for timing signals, comprising:

a plurality of clock generators configured to selectively generate said timing signals, said plurality of clock generators being individually programmable under software control, wherein said clock generators include a plurality of digital delay elements configured to progressively delay said timing signals, said digital delay elements being coupled to a looped-back clock; and a plurality of distribution lines coupled to said clock generators and configured to distribute said timing signals.

2. A distribution system for timing signals, comprising:

a plurality of clock generators configured to selectively generate said timing signals, said plurality of clock generators being individually programmable under software control, wherein said clock generators include a plurality of digital delay elements configured to progressively delay said timing signals, said digital delay elements being coupled to a plurality of clocks; and a plurality of distribution lines coupled to said clock generators and configured to distribute said timing signals.

3. The distribution system of claim 2, wherein said timing signals are selected from one of said plurality of clocks.

4. A method for generating and distributing timing signals, comprising the steps of:

generating said timing signals utilizing a plurality of clock generators configured to selectively generate said timing signals, said plurality of clock generators being individually programmable under software control, wherein said clock generators include a plurality of digital delay elements configured to progressively delay said timing signals, said digital delay elements being coupled to a looped-back clock; and distributing said timing signals utilizing a plurality of clock signal distribution signal lines coupled to said clock generators and configured to distribute said timing signals.

5. A method for generating and distributing timing signals, comprising the steps of:

generating said timing signals utilizing a plurality of clock generators configured to selectively generate said timing signals, said plurality of clock generators being individually programmable under software control, wherein said clock generators include a plurality of digital delay elements configured to progressively delay said timing signals, said digital delay elements being coupled to a plurality of clocks; and distributing said timing signals utilizing a plurality of clock signal distribution signal lines coupled to said clock generators and configured to distribute said timing signals.

6. The method of claim 5, wherein said timing signals are selected from one of said plurality of clocks.

\* \* \* \* \*